(12) United States Patent
Searle et al.

(10) Patent No.: US 6,204,709 B1
(45) Date of Patent: Mar. 20, 2001

(54) UNLIMITED PHASE TRACKING DELAY LOCKED LOOP

(75) Inventors: Kenneth Michael Searle, Dunmow; Alan Jonathan Andrew Trainor, Harlow, both of (GB)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/409,539

(22) Filed: Sep. 30, 1999

(51) Int. Cl.[7] .................................................. H03H 11/16
(52) U.S. Cl. ............................................. 327/231; 327/156
(58) Field of Search .................................... 327/231–238, 327/243, 244, 254–256, 141, 147, 150, 156, 158, 159, 163; 375/376

(56) References Cited

U.S. PATENT DOCUMENTS

| 5,122,757 | * | 6/1992 | Weber et al. | 327/254 |
| 5,608,796 | * | 3/1997 | Banu et al. | 327/254 |
| 5,939,916 | * | 8/1999 | Jamal et al. | 327/231 |

* cited by examiner

Primary Examiner—My-Trang Nu Ton
(74) Attorney, Agent, or Firm—Lee, Mann, Smith, McWilliams, Sweeney & Ohlson

(57) ABSTRACT

The invention comprises a phase shifter reset circuit, for phase shifting an input signal, and includes a phase shifter, for shifting the phase of an input signal by a phase determined by a phase shift reference signal and a resetter, for resetting the phase shift reference signal in response to a trigger signal. Also included is a fixed phase shifter for shifting the phase of the input signal by a predetermined phase shift which is connected in parallel with said phase shifter and a threshold detector circuit set to a threshold level which is substantially equivalent to the voltage level required by the phases shifter to produce the same phase shift as is introduced into the input signal by the fixed phase shifter. A bypass circuit is disposed between the phase shifters and the output and includes a switch for selecting a signal from either the phase shifted input signal or said fixed phase shifted signal. The bypass circuit responds to a switching signal in order to switch from the phase shifted input signal to said fixed phase shifted signal for a predetermined period of time, during which time the trigger signal for resetting the phase shifter is generated, before switching back to the phase shifted input signal. The invention includes a method of resetting a phase shifter. Also included in the invention is a delay locked loop incorporating the phase shifter reset circuit and a method of inserting a delay into an input signal using a delay locked loop according to the invention.

22 Claims, 9 Drawing Sheets

UNLIMITED PHASE TRACKING DELAY LOCKED LOOP

BACKGROUND OF THE INVENTION

This invention relates to a method and apparatus for enabling unlimited phase tracking in high speed data synchronisation, for example in telecommunications equipment. The invention relates in particular to a delay locked loop which provides continuous, precise alignment of two signals in excess of one signal period. The invention also relates to a phase shifter circuit which provides phase shifting over more than one signal period.

With increasingly higher data rates becoming common place, particularly in optical systems, it is becoming increasingly difficult to guarantee clock and data alignment. Variations in integrated circuit parameters and printed circuit board signal delays leave a very small time in which clock and data signals may be aligned. These signal delays vary with production tolerances and operating temperatures which can cause significant design problems at high data rates. Frequency and phase locked loops are often used to manage the clock and data alignment and to maintain data integrity throughout the operating range of the high speed data equipment. A delay locked loop, which is a type of phase locked loop, uses a phase detector to generate an error voltage proportional to the phase difference between two input signals. The error voltage is, in turn used to control a phase shifter which adjusts the delay, or phase, of one of the signals to achieve phase alignment of the two signals. Such a circuit allows the phase changes of either signal to be continuously and precisely tracked. The circuit is limited to tracking changes of less than one signal period, that is phase differences in excess of ±180° may not be accurately tracked by the phase shifter and can cause the loop to become unstable.

One accepted method of overcoming this instability is to detect the limit of the phase difference and to recentre the phase shifter. Since it is not possible to maintain signal alignment whilst the phase shifter, and thus the loop, is being reset, this results in a temporary loss of alignment. As a consequence, such circuits are unsuitable for use in high speed data equipment where the temporary loss of alignment can severely affect the data integrity of several kilobytes of data.

An alternative approach may be to operate the loop at a submultiple frequency of the signals being tracked. The disadvantage of this approach is that the original frequency needs to be recovered before the output signals can be used. This process introduces further errors and complications into the circuitry.

There is thus a need for an improved phase shifter and delay locked loop which do not suffer from the disadvantages outlined above.

It is an object of the invention to provide a phase shifter which can track phase changes seamlessly, which maintains alignment throughout all phase differences and which does not introduce further complexity or errors.

SUMMARY OF THE INVENTION

According to a first aspect of the invention there is provided a phase shifter reset circuit, for phase shifting an input signal, having an input and an output, comprising:

a phase shifter, having a first input for receiving said input signal, a second input for receiving a phase shift reference signal and an output for outputting a phase shifted input signal, wherein the phase of the input signal is shifted by a phase shifter determined by the phase shift reference signal;

a resetter, for resetting the phase shift reference signal in response to a trigger signal;

a fixed phase shifter, for shifting the phase of said input signal by a predetermined phase shift, connected in parallel with said phase shifter, having an input for receiving said input signal and an output for outputting a fixed phase shifted input signal;

a threshold detector circuit, having an input for receiving said phase shift reference signal and an output for outputting a switching signal when said phase shift reference signal reaches a threshold level, substantially equivalent to the phase shift introduced into said input signal by the fixed phase shifter;

a bypass circuit, disposed between said phase shifters and said output, having two inputs for receiving, respectively, said phase shifted input signal and said fixed phase shifted signal, a switch for selecting a selected signal from either said phase shifted input signal or said fixed phase shifted signal, an output for outputting said selected signal and means for generating said trigger signal, whereby said switch is responsive to said switching signal to switch from said phase shifted input signal to said fixed phase shifted signal for a predetermined period of time, during which time said trigger signal is generated, before switching back to said phase shifted input signal.

According to a second aspect of the invention there is provided a method of resetting a phase shifter to provide a continuously phase shifted output signal comprising:

phase shifting, in a phase shifter, said input signal by a phase shift determined by a phase shift reference signal to produce a phase shifted input signal;

resetting said phase shifter in response to a trigger signal;

phase shifting, in a fixed phase shifter disposed in parallel with said phase shifter, said input signal by a predetermined phase shift to produce a fixed phase shifted input signal;

detecting in a threshold detector when said phase shift reference signal reaches a predetermined threshold, equivalent to the phase shift introduced by said fixed phase shifter and generating in response a switching signal;

switching at said output, in response to said switching signal, from said phase shifted input signal to said fixed phase shifted input signal for a predetermined period of time, during which time said trigger signal is generated, before switching back to said phase shifted input signal.

According to a third aspect of the invention there is provided a first input for receiving an input signal, a delay locked loop, having an output for generating an output signal and a second input for receiving a delayed version of output signal, for inserting a delay representative of the delay inserted into the output signal into the output signal comprising:

a phase detector, having a first input for receiving said input signal and a second input for receiving said delayed version of the output signal, for generating and outputting at an output a phase shift reference signal representative of the phase difference between said input signal and said delayed version of the output signal;

a phase shifter, having a first input for receiving said input signal, a second input for receiving said phase shift reference signal and an output for outputting a phase shifted input signal, wherein the phase of the input signal is shifted by a phase shift determined by the phase shift reference signal;

a resetter, for resetting the phase shift reference signal in response to a trigger signal;

a fixed phase shifter, for shifting the phase of said input signal by a predetermined phase shift, connected in parallel with said phase shifter, having an input for receiving said input signal and an output for outputting a fixed phase shifted input signal;

a threshold detector circuit, having an input for receiving said phase shift reference signal and an output for outputting a switching signal when said phase shift reference signal reaches a threshold level, substantially equivalent to the phase shift introduced into said input signal by the fixed phase shifter;

a bypass circuit, disposed between said phase shifters and said output, having two inputs for receiving, respectively, said phase shifted input signal and said fixed phase shifted signal, a switch for selecting a selected signal from either said phase shifted input signal or said fixed phase shifted signal, an output for outputting said selected signal and means for generating said trigger signal, whereby said switch is responsive to said switching signal to switch from said phase shifted input signal to said fixed phase shifted signal for a predetermined period of time, during which time said trigger signal is generated, before switching back to said phase shifted input signal.

According to a fourth aspect of the invention there is provided a method of inserting a delay into an input signal to produce an output signal, said delay being representative of a delay inserted into delayed version of the output signal, comprising:

generating a phase shift reference signal representative of the phase difference between said input signal and said delayed version of said output signal;

phase shifting in a phase shifter, said input signal by a phase shift determined by the phase shift reference signal to produce a phase shifted input signal;

resetting said phase shifter in respect to a trigger signal;

phase shifting, in a fixed phase shifter disposed in parallel with said phase shifter, said input signal by a predetermined fixed phase shift to produce a fixed phase shifted input signal;

detecting in a threshold detector when said phase shift reference signal reaches a predetermined threshold level, equivalent to the phase shift introduced by said fixed phase shifter and generating in response a switching signal;

switching at said output, in response to said switching signal, from said phase shifted input signal to said fixed phase shifted input signal for a predetermined period of time, during which time said trigger signal is generated, before switching back to said phase shifted input signal.

The phase shift reference signal may be generated by a phase detector device and may thus represent the difference between two signals which require phase, or delay, alignment. Thus the phase shifter reset circuit and method may form an integral part of a delay locked loop. The output signal is, according to the invention, maintained throughout the range of possible phase shifts and allows the phase shifter to be reset and to stabilise without affecting the output signal. By temporarily by-passing the phase shifter, the integrity of the output signal is maintained through the reset process, thereby enabling the phase shifter circuit to track phase shifts of more than one period. The phase shifter circuit of the invention is considerably more reliable than those of the prior art because it is not limited to the traditional 360° range.

BRIEF DESCRIPTION OF THE DRAWINGS

Embodiments of the invention will now be described, by way of example only, with reference to the following figures, in which.

DESCRIPTION OF THE PREFERRED EMBODIMENTS

Figure 1:
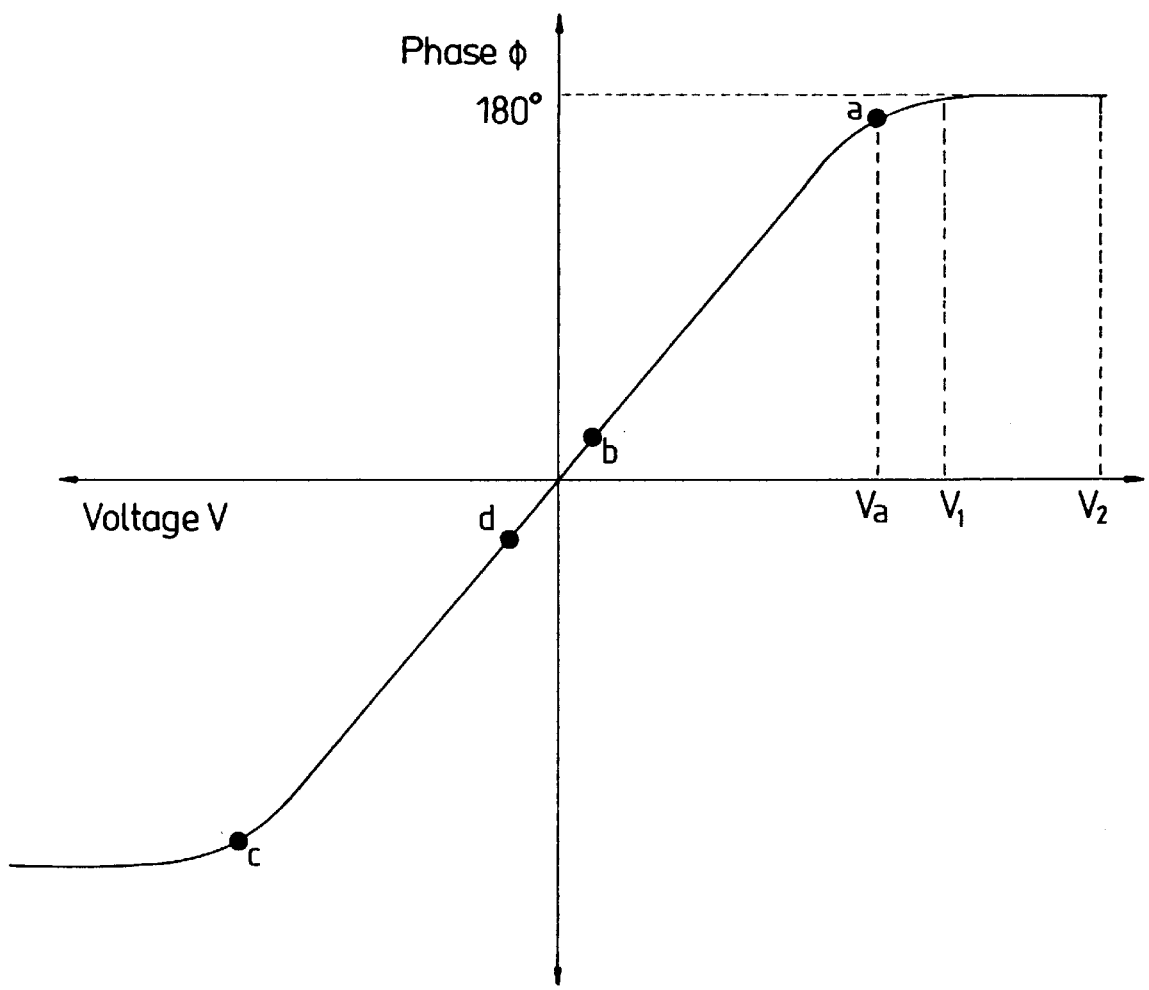
FIG. 1 illustrates the limits phase shift produced by a conventional phase shifter.

FIG. 1 shows a plot of control voltage (i.e. phase shift reference signal voltage) against phase output for a known phase shifter. As the control voltage varies the phase shift introduced into an input signal varies in response. As the control voltage reaches threshold point "a", the phase shift introduced approaches 180°. Because the input drive is limited, the output characteristics of the phase shifter is discontinuous; that is, it is not possible for the phase shifter to move from point "a" to point "c", since the output gets "stuck" at the limits. Any system, such as a delay locked loop (DLL) employing such a phase shifter will be unreliable and may introduce errors whilst the phase shifter tries to move near to or across the 180° boundary.

Figure 2:
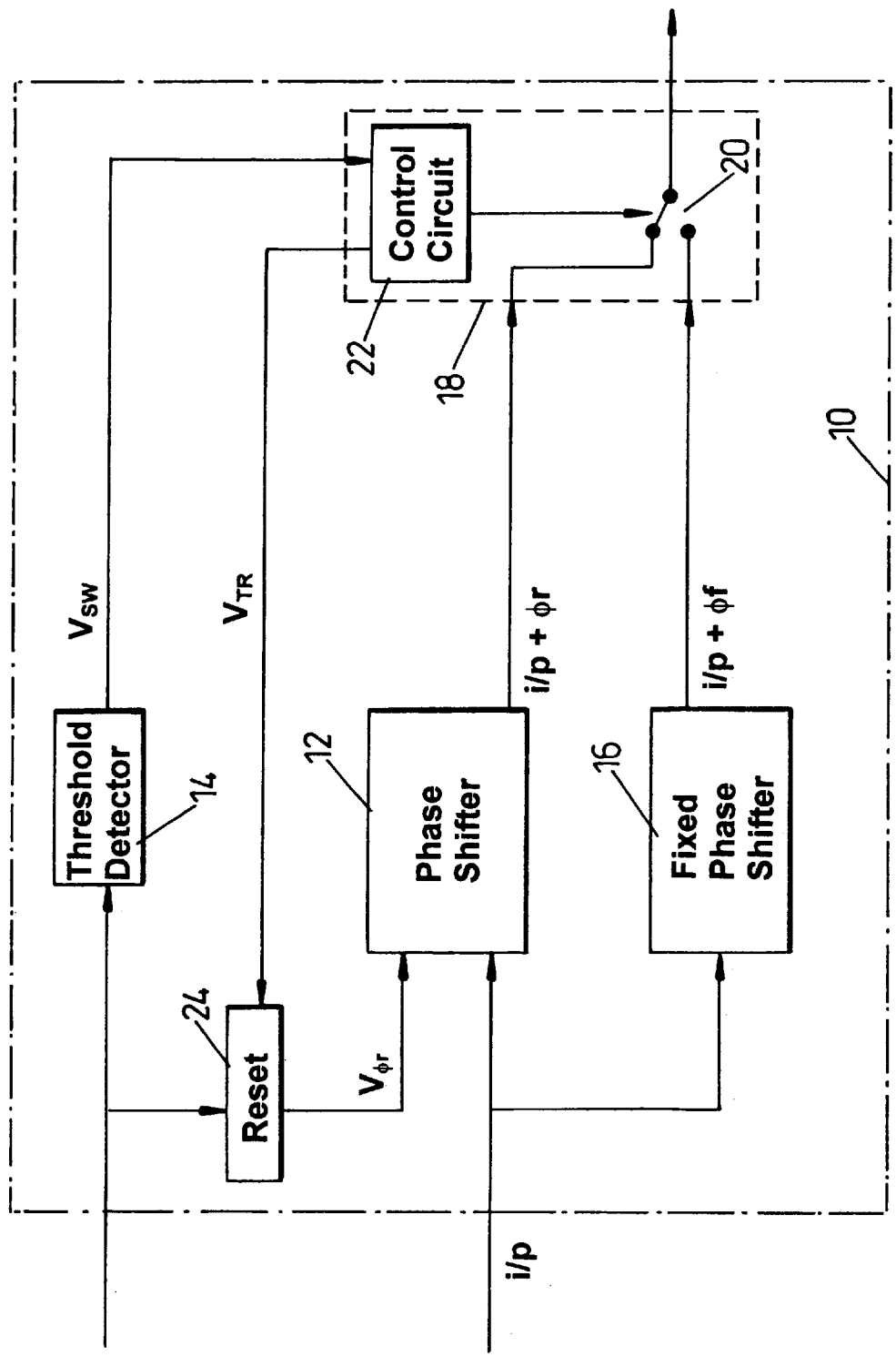
FIG. 2 shows in outline a phase shifter according to the invention.

FIG. 2 shows in outline a continuous phase shifter circuit (10) according to the invention. The phase of an input signal (i/p) is shifted by phase shifter (12) by an amount set by the phase shift reference signal voltage ($V_{100\ r}$). The voltage level of the phase shift reference signal is also continuously monitored by a threshold detector circuit (14). In parallel with the phase shifter (12) is a fixed phase shifter (16) which introduces a predetermined phase shift into the input signal. This predetermined phase shift is set to be similar to the threshold phase shift Voltage ($V_a$ of FIG. 1), that is, that phase shift produced at point "a" (just before the phase shifter becomes unreliable). Alternatively and if appropriate, the phase shift of the fixed phase shift may be 180° (that is an inversion of the input signal) and the threshold is thus $V_1$ (equivalent to 180°).

Let us assume that the threshold detector circuit is set to a threshold value ($V_a$) and detects a control voltage which would introduce phase shift from the phase shifter also of $\phi_a$. When the phase shift reference signal voltage reaches the threshold value $V_a$ it generates a switching signal ($V_{SW}$) which causes the by-pass circuit (18) to bypass the phase shifter (12). The internal function of the bypass circuit is described in more detail herein below. However, in its simplest form, the bypass circuit comprises a simple switch (20) and a simple timer and control logic (22) which generates a trigger signal ($V_{TR}$). The switch is normally set to pass the phase shift input signal (i/p+$\phi_r$) as its output. When prompted by the switching signal, the switch passes, in place of the phase shifted input signal, the fixed phase shifted input signal (i/p+$\phi_f$) as its output. The switch remains engaged for a predetermined period, sufficiently long enough for the control logic to generate the trigger signal to reset the phase shifter via reset logic (24). The phase shifter is reset to point "d" and allowed to settle before the switch switches back to passing the phase shifted input signal as its output.

Figure 3:
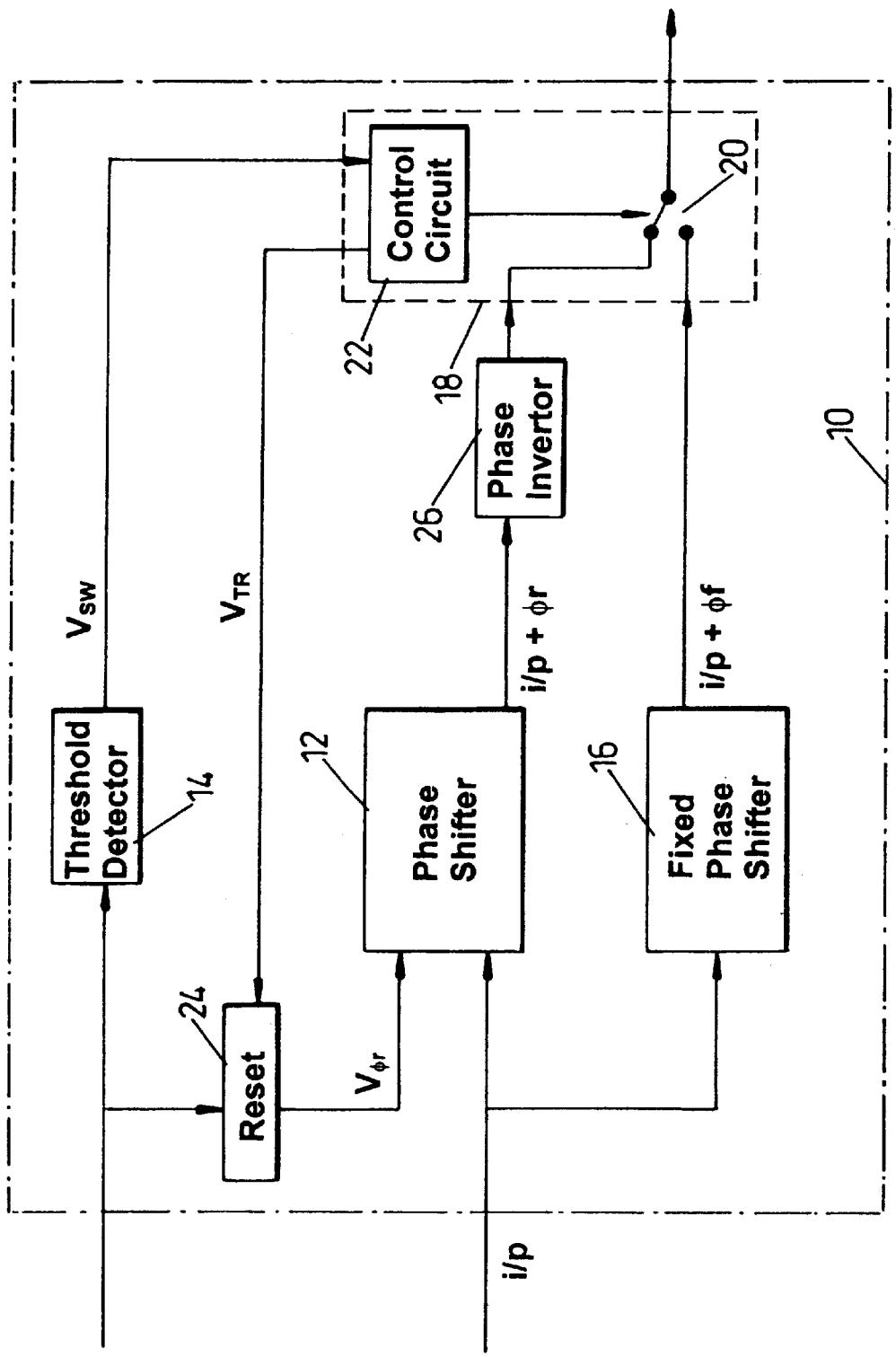
FIG. 3 shows in outline an alternative phase shifter according to the invention.

FIG. 3 shows an alternative embodiment of the phase shifter including a phase invertor (26). In this embodiment the phase shifter (12) is reset to point b and the phase of the phase shifter is inverted by phase invertor (26) to maintain the phase of the circuit output signal. The advantage of this embodiment is that the start up position and the reset position can be the same; with the embodiment illustrated in FIG. 2, the reset position is dependent upon the threshold point reached by the phase shifter circuit (that is point a is reset to point d and point c is reset to point b). This requires more complex reset circuitry.

If the threshold limit is set at $V_1$ (as shown on FIG. 1) and discussed above, phase shifter (16) may be replaced by a phase invertor which introduces a phase shifter of 180° in the input signal. Thus the bypass process is initiated when the required phase shift is also 180°. The advantage of this approach is that during the bypass the phase shifter may be reset to zero, which requires simpler circuitry than the offset devices described above.

Figure 4:
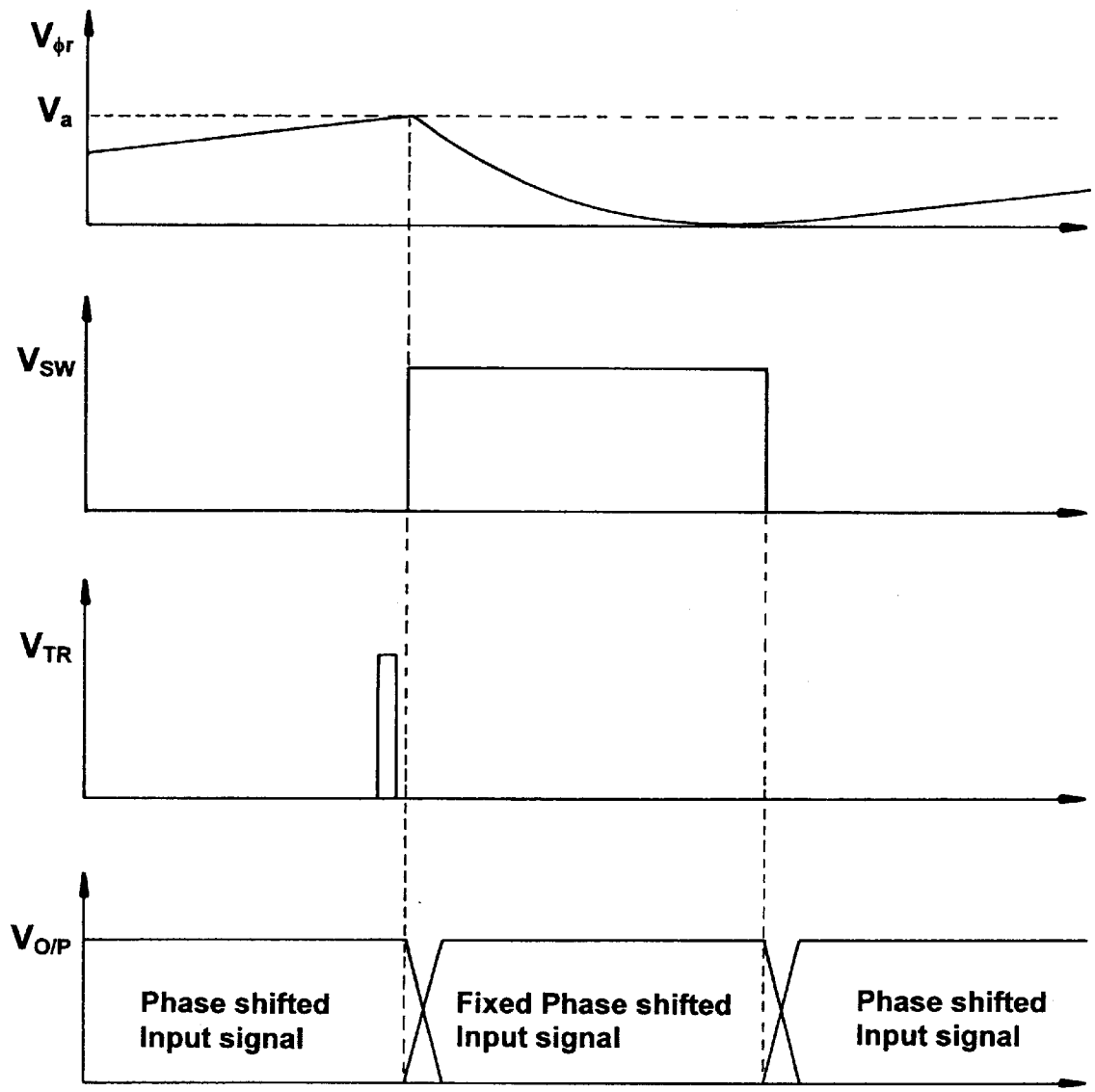
FIG. 4 shows a timing diagram for the signals generated by the circuit of FIG. 2.

FIG. 4 shows the operation of signals produced by the circuits of FIGS. 2 & 3 and assumes a threshold voltage of $V_1$ (i.e. 180°). When the phase shift reference signal voltage reaches a threshold value $V_1$ the switching signal $V_{SW}$ is generated, during which time the output is switched from the phase shifted input signal to the fixed phase shifted input signal. The timing diagram of FIG. 4 is based on the assumption that the phase shift reference signal voltage gradually increases or decreases over time; such an assumption is valid if the reference signal drifts gradually from an initial standard e.g. due to a gradual temperature or humidity increase. It is also assumed that the phase shift reference signal voltage $V_{100\ r}$ is not reset instantaneously when the control circuit generates the trigger voltage $V_{TR}$ to zero but decays over a period of time; the output is kept at the fixed phase shift signal until that decay is completed.

Figure 5:
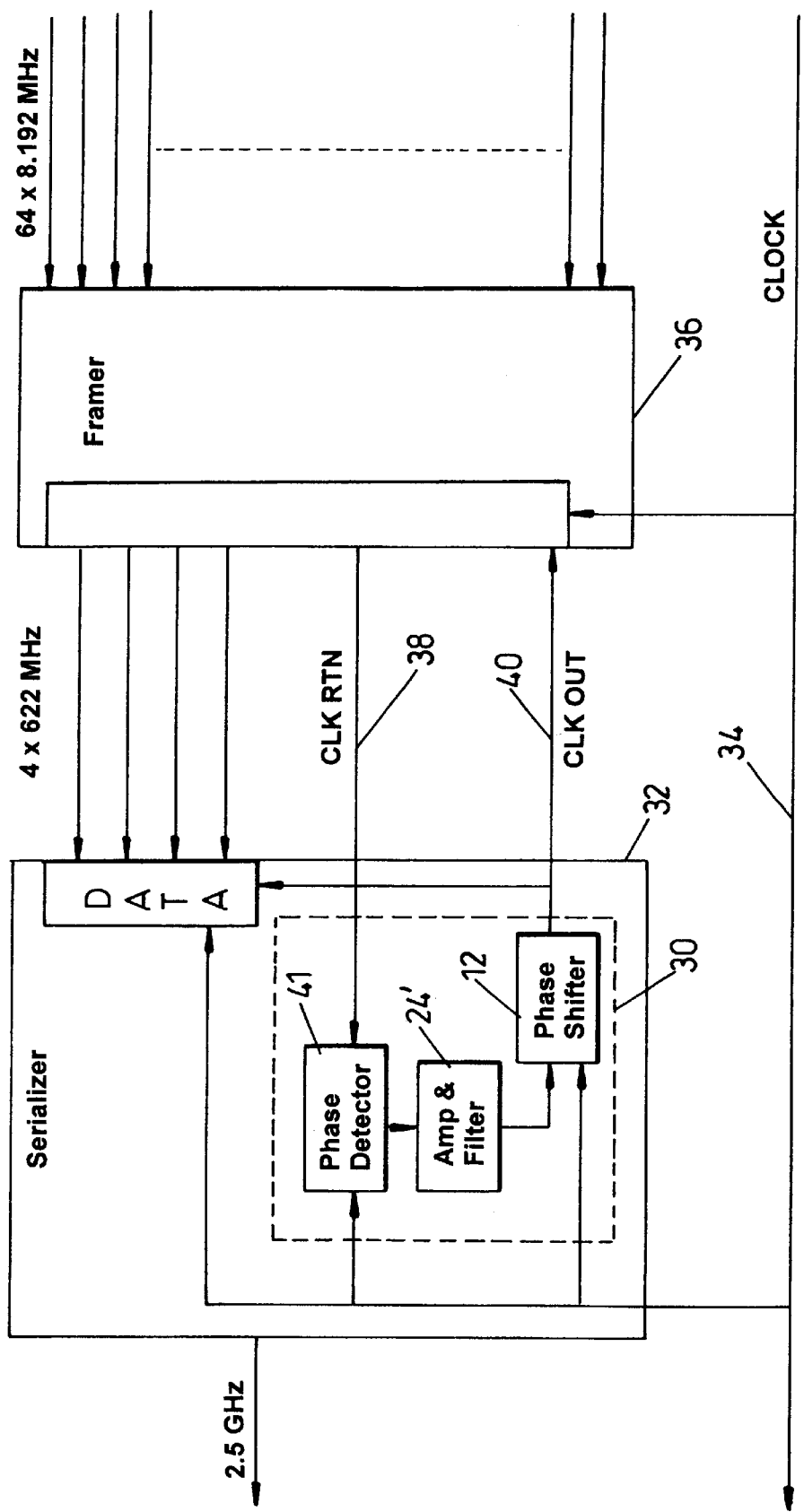
FIG. 5 shows in outline a delay locked loop according to the invention.

FIG. 5 shows in outline a data frame and a data serializer which employ a delay locked loop (DLL 30). The DLL is used in a serializer circuit (32) to align the clock signal (34) received by the serializer with a clock signal employed by a framer (36), upstream from the serializer. In manufacturing such devices into high speed data equipment, the clock signal received by the framer may be out of phase, in absolute terms, with the clock signal received by the serializer. Since the two devices need to communicate data signals, such relative non-alignment of the clocks, and thus of the data sampling points, may cause data to be lost, corrupted or generated erroneously.

In addition, the phase or delay offset between the clock signals employed by the two circuits may vary with time, temperature, humidity etc, assuming a fixed delay is not appropriate when data integrity needs to be maintained over a significant period e.g. several days. The internal and external delays may be unpredictable and may drift by several signal or clock periods during operation. The DLL thus measures the difference between the reference clock (34) employed in the serializer and the clock signal returned by the framer and generates an adjusted (i.e. phase shifted) clock signal to be used where necessary in the serializer.

Figure 6:
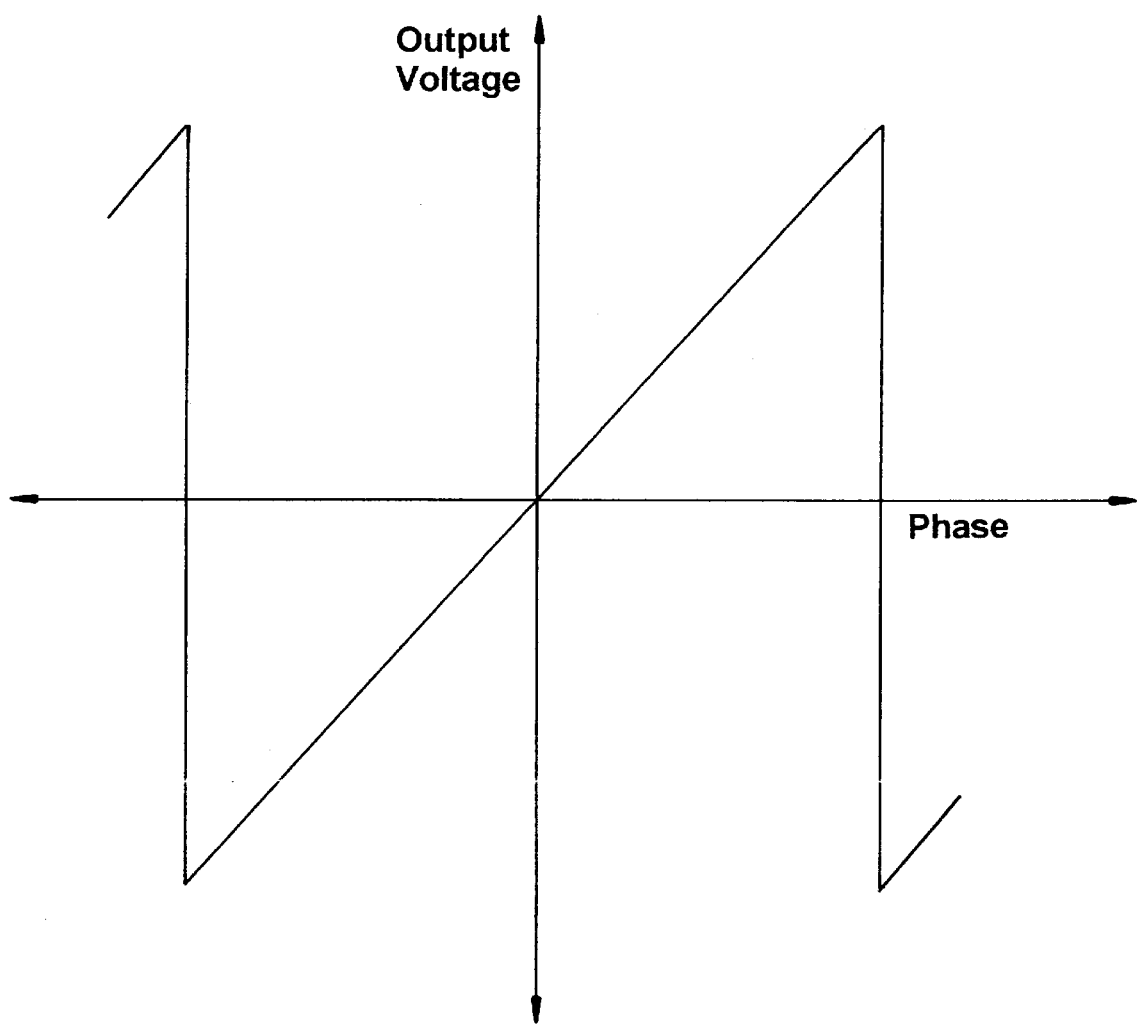
FIG. 6 illustrates the output characteristic of a phase detector.

The action of the phase detector is to produce an output signal, which is a pulse stream whose duty cycle varies according to the phase difference between two input signals. This output signal is low pass filtered or integrated to produce a low frequency signal that varies according to the mean level of the pulse stream. This low frequency signal is then amplified to increase the sensitivity of the loop. The amplification and integration function may be combined using a high gain amplifier, which uses a capacitor as the feedback path. With reference to FIG. 6, the phase detector characteristic is approximately linear with an abrupt change in output from maximum positive value to maximum negative value at typical phase values of +180° or −180°.

The action of the DLL is to maintain edge alignment of the returned clock (38) with the reference clock (34) by adjusting the phase shifter (12) to produce a phase shifted clock signal (CLOCK OUT 40). After acquiring lock, the loop maintains lock as the phase delay introduced by the external path in the framer changes. As discussed above, the analogue phase shifter has a limited range of +/−180°, as shown in FIG. 1. When the 180° limit is reached, without the use of the bypass circuit of the invention, the loop will loose lock, and data may thus be sampled and generated erroneously. Any change to the phase shift reference voltage $V_{100\ r}$ will have a delay dictated by the filter characteristics. The filter time constant may be 1000 times greater than the reference clock and during this time the clock out may be significantly out of alignment from the reference clock and/or the returned clock.

Figure 7:
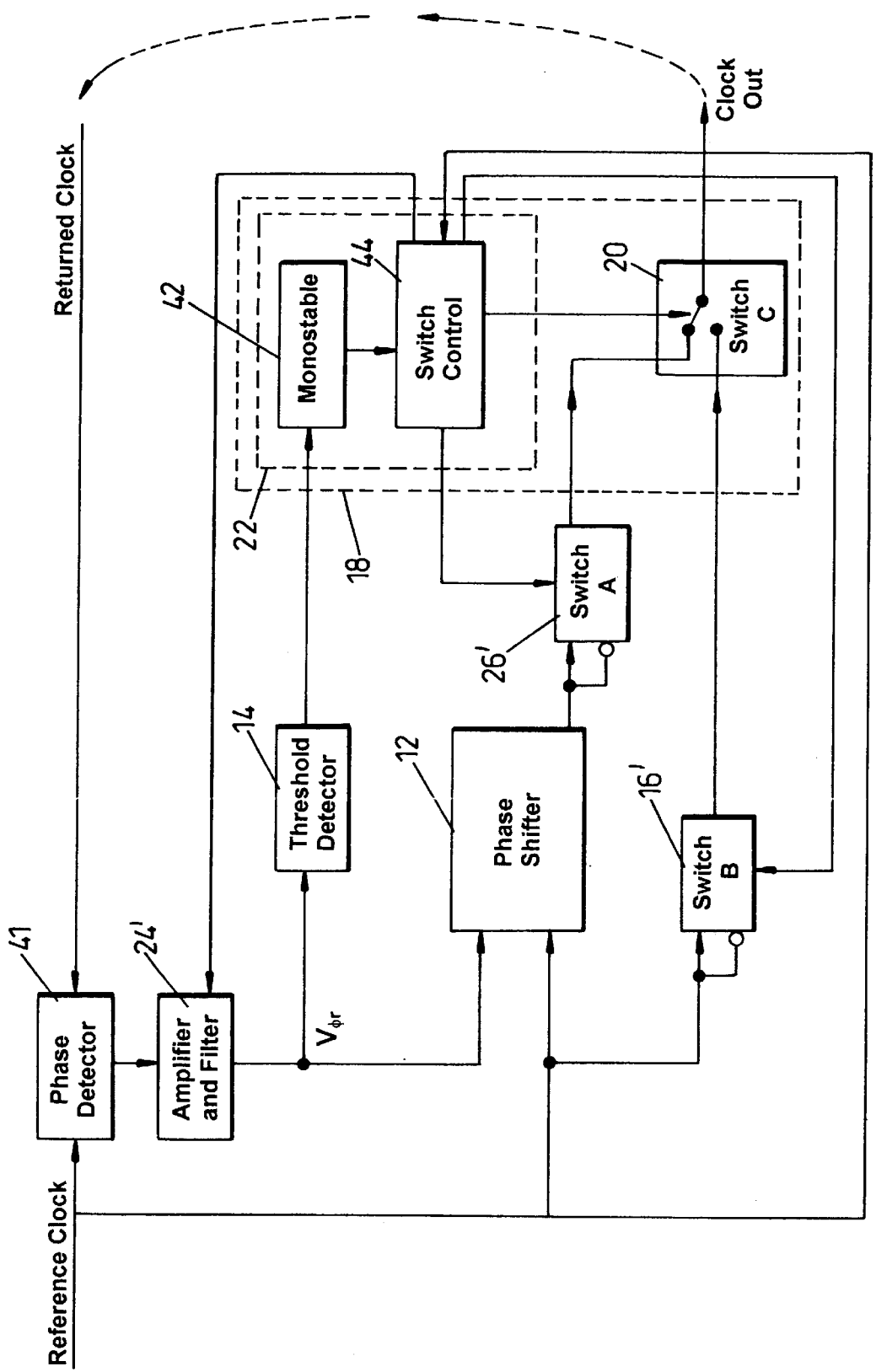
FIG. 7 shows in more detail a delay locked loop according to the invention.

FIG. 7 shows in more detail a DLL according to the invention. In order to continue to pass an error free output signal, that is to keep edge alignment, at its limits the phase shifter is substituted by a fixed phase shifted version of the reference clock. In operation, the phase detector generates a difference signal by differencing the reference clock with the returned clock.

The amplifier and filter circuit (24') functions as described above, in connection with FIG. 5, to provide a reference signal $V_{100\ r}$. The threshold detector (14) triggers at an amplitude equivalent to 180° phase shift of either polarity. This in turn triggers monostable (42), which has a period greater than the reset period of the loop filter and which in turn triggers the switch control (44). In preparation for the reset sequence, Switch B is activated to provide a signal 180° shifted from its previous output signal. The switch control activates switch C (20) to switch its output from the phase shifter (12) to the output of switch B (16'). Switch B inserts a 180° fixed phase shift inverting the reference clock (i.e. the input signal) and is used as the fixed phase shifter. Switch A (26') is activated, having been previously isolated from the output by switch C. Switch A inverts the signal (equivalent to a 180° phase shift). The output voltage on the filter of the reset circuit (24') is then discharged to zero. This combination of zero phase shift from the phase shifter and the inversion of switch A again produces the same phase shift as before initiation of the reset sequence, but with the reference voltage $V_{100\ r}$ set again to zero. At the end of the monostable period, switch C is activated to return the output of the phase shifter as to the output signal source.

Figure 8:
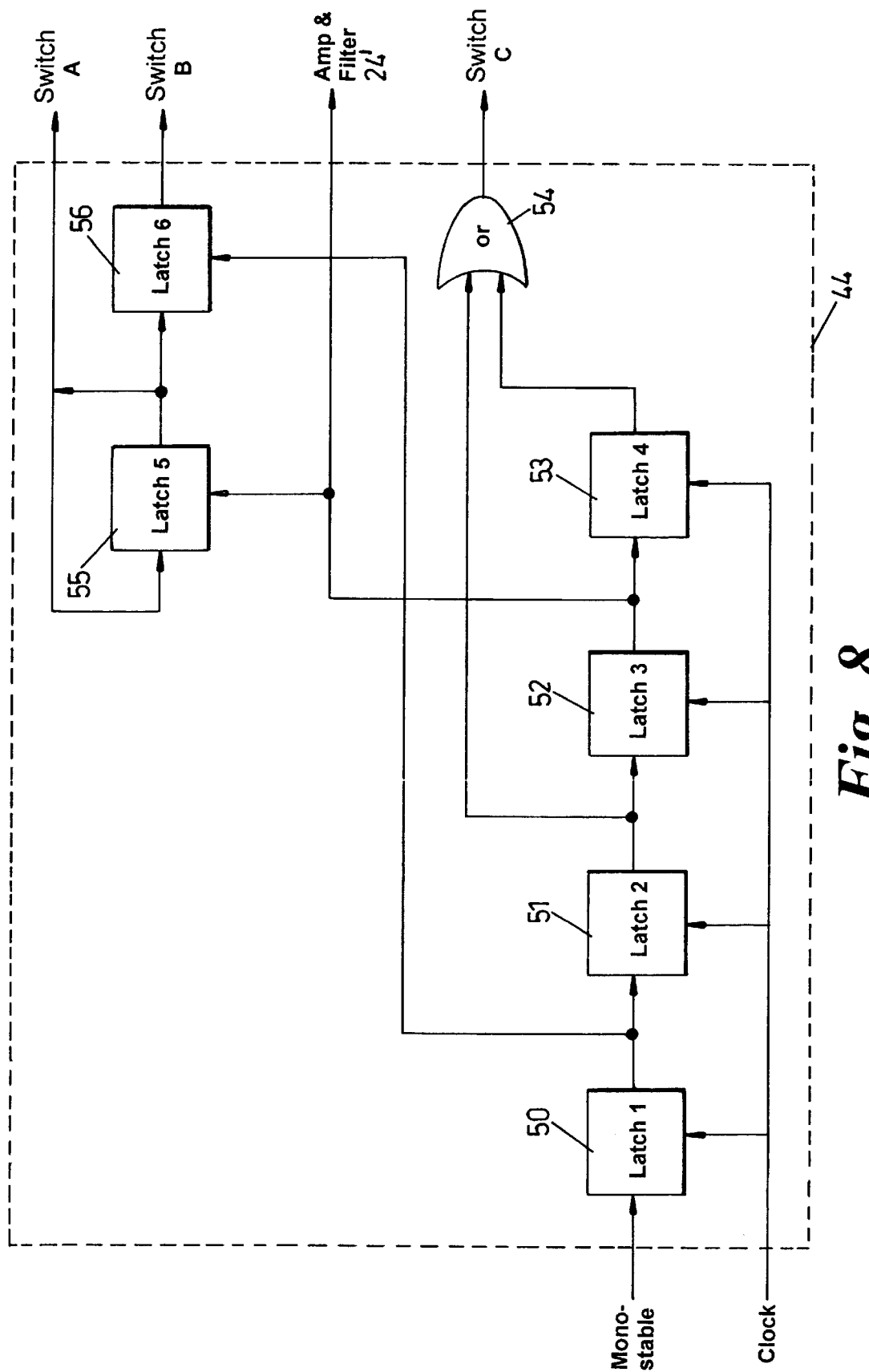
FIG. 8 shows a block schematic of a switch control device according to the invention.

FIG. 8 shows a block schematic of switch control (44) which is designed to take all timing from a rising clock edge. It is also designed such that all switch transitions occur on the falling clock edge, enabling all switching activity to be completed before the rising edge occurs and thereby giving a seamless reset cycle.

Figure 9:
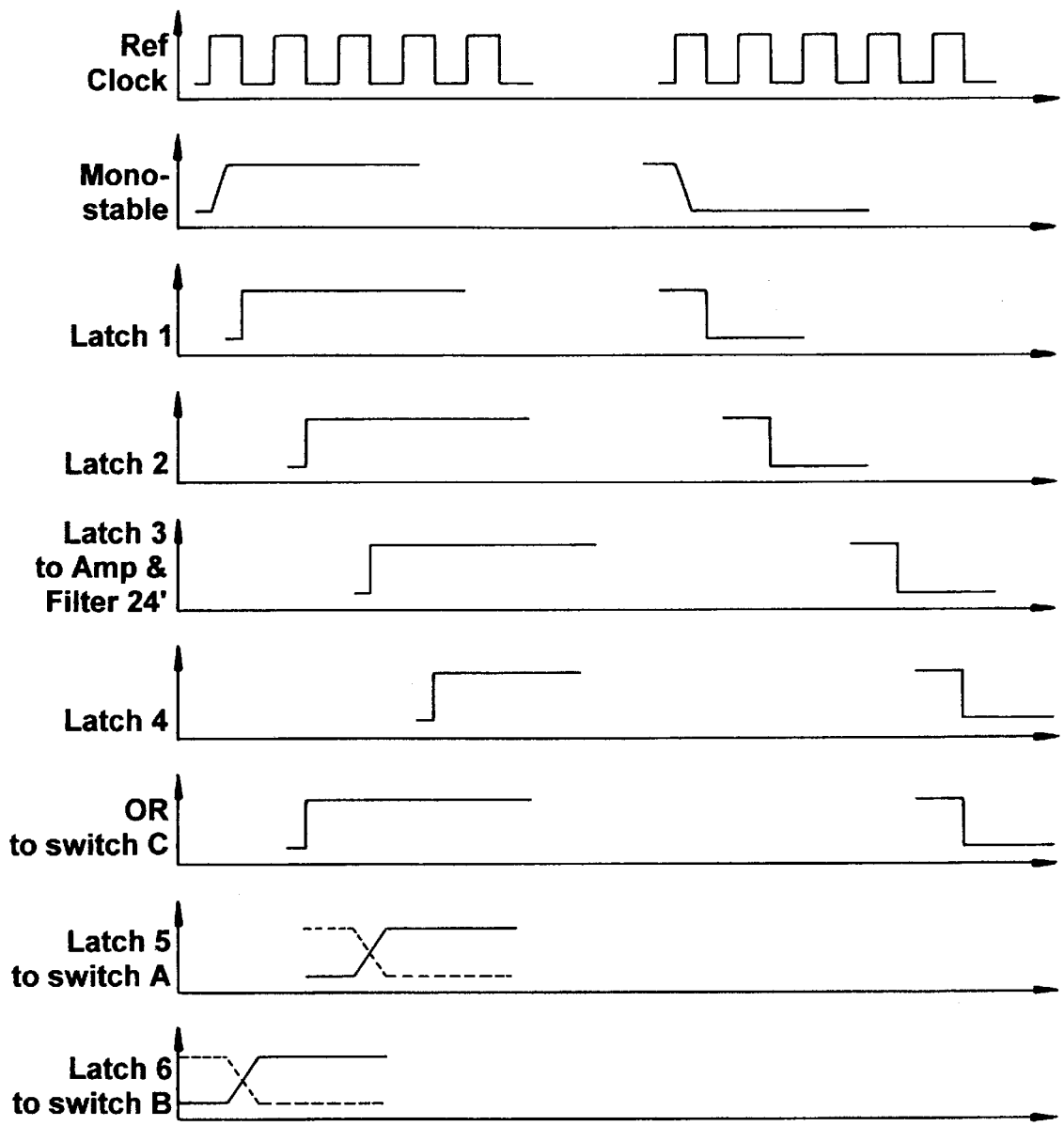
FIG. 9 shows timing diagram for the switch control of FIG. 8.

The circuit shown in FIG. 8 may be used to generate the sequence of control signals to switches and filter reset functions. The sequence is illustrated in FIG. 9. After the monostable output changes state the signal moves sequentially through latches 1 to 4 (51 to 53) on successive negative (falling) clock edges. The output of latch 3 (52) is used to enable and hold the filter reset circuit (24'). Switch control latches 5 and 6 (55 and 56) which control switches A and B respectively are toggled to their other state once in each reset cycle. The output of the OR gate (54) is used to control the state of switch C.

What is claimed is:

1. A phase shifter reset circuit, for phase shifting an input signal, having an input and an output, comprising:
    a phase shifter, having a first input for receiving said input signal, a second input for receiving a phase shift reference signal and an output for outputting a phase shifted input signal, wherein the phase of the input signal is shift by a phase shifter determined by the phase shift reference signal;
    a resetter, for resetting the phase shift reference signal in response to a trigger signal;
    a fixed phase shifter, for shifting the phase of said input signal by a predetermined phase shift, connected in parallel with said phase shifter, having an input for receiving said input signal and an output for outputting a fixed phase shifted input signal;
    a threshold detector circuit, having an input for receiving said phase shift reference signal and an output for outputting a switching signal when said phase shift reference signal reaches a threshold level, substantially equivalent to the phase shift introduced into said input signal by the fixed phase shifter;
    a bypass circuit, disposed between said phase shifters and said output, having two inputs for receiving, respectively, said phase shifted input signal and said fixed phase shifted signal, a switch for selecting a selected signal from either said phase shifted input signal or said fixed phase shifted signal, an output for outputting said selected signal and means for generating said trigger signal, whereby said switch is responsive to said switching signal to switch from said phase shifted input signal to said fixed phase shifted signal for a predetermined period of time, during which time said trigger signal is generated, before switching back to said phase shifted input signal.

2. A phase shifter reset circuit as claimed in claim 1, wherein the resetter comprises an amplifier and a filter.

3. A phase shifter reset circuit as claimed in claim 1, wherein the fixed phase shifter inverts the input signal to provide the fixed phase shifted input signal.

4. A phase shifter reset circuit as claimed in claim 3, wherein the threshold level is set to a level representative of 180° phase shift from the phase shifter.

5. A phase shifter reset circuit as claimed in claim 1 wherein the bypass circuit comprises a timer circuit, a control logic and a switch.

6. A phase shifter reset circuit as claimed in claim 1 wherein said predetermined period of time is sufficient for said resetter to reset.

7. A delay locked loop including a phase shifter reset circuit according to claim 1.

8. A framer and a serializer combination including a delay locked loop according to claim 7.

9. A method of resetting a phase shifter to provide a continuously phase shifted output signal comprising:
    phase shifting, in a phase shifter, said input signal by a phase shift determined by a phase shift reference signal to produce a phase shifted input signal;
    resetting said phase shifter in response to a trigger signal;
    phase shifting, in a fixed phase shifter disposed in parallel with said phase shifter, said input signal by a predetermined fixed phase shift to produce a fixed phase shifted input signal;
    detecting in a threshold detector when said phase shift reference signal reaches a predetermined threshold level, equivalent to the phase shift introduced by said fixed phase shifter and generating in response a switching signal;
    switching at said output, in response to said switching signal, from said phase shifted input signal to said fixed phase shifted input signal for a predetermined period of time, during which time said trigger signal is generated, before switching back to said phase shifted input signal.

10. A method as claimed in claim 9, wherein the fixed phase shift is an inversion of the input signal.

11. A method as claimed in claim 9, wherein the threshold is set to a level representative of 180° phase shift from the phase shifter.

12. A method as claimed in claim 9, whereby the predetermined period of time is sufficient to reset said phase shifter.

13. A delay locked loop for receiving an input signal, a delay locked loop, having an output for generating an output signal and a second input for receiving a delayed version of output signal, for inserting a delay representative of the delay inserted into the output signal comprising:
    a phase detector, having a first input for receiving said input signal and a second input for receiving said delayed version of the output signal, for generating and outputting at an output a phase shift reference signal representative of the phase difference between said input signal and said delayed version of the output signal;
    a phase shifter, having a first input for receiving said input signal, a second input for receiving said phase shift reference signal and an output for outputting a phase shifted input signal, wherein the phase of the input signal is shifted by a phase shift determined by the phase shift reference signal;
    a resetter, for resetting the phase shift reference signal in response to a trigger signal;
    a fixed phase shifter, for shifting the phase of said input signal by a predetermined phase shift, connected in parallel with said phase shifter, having an input for receiving said input signal and an output for outputting a fixed phase shifted input signal;
    a threshold detector circuit, having an input for receiving said phase shift reference signal and an output for outputting a switching signal when said phase shift reference signal reaches a threshold level, substantially equivalent to the phase shift introduced into said input signal by the fixed phase shifter;
    a bypass circuit, disposed between said phase shifters and said output, having two inputs for receiving, respectively, said phase shifted input signal and said fixed phase shifted signal, a switch for selecting a selected signal from either said phase shifted input signal or said fixed phase shifted signal, an output for outputting said selected signal and means for generating said trigger signal, whereby said switch is responsive to said switching signal to switch from said phase shifted input signal to said fixed phase shifted signal for a predetermined period of time, during which time said trigger signal is generated, before switching back to said phase shifted input signal.

14. A delay locked loop as claimed in claim 13, wherein the resetter comprises an amplifier and a filter.

15. A delay locked loop as claimed in claim 13, wherein the fixed phase shifter inverts the input signal to provide the fixed phase shifted input signal.

16. A delay locked loop as claimed in claim 15, wherein the threshold level is set to a level representative of 180° phase shift from the phase shifter.

17. A delay locked loop as claimed in claim 13 wherein the bypass circuit comprises a timer circuit, a control logic and a switch.

18. A delay locked loop as claimed in claim 13 wherein said predetermined period of time is sufficient for said resetter to reset.

19. A method of inserting a delay into an input signal to produce an output signal, said delay being representative of a delay inserted into delayed version of the output signal, comprising:

generating a phase shift reference signal representative of the phase difference between said input signal and said delayed version of said output signal;

phase shifting in a phase shifter, said input signal by a phase shift determined by the phase shift reference signal to produce a phase shifted input signal;

resetting said phase shifter in respect to a trigger signal;

phase shifting, in a fixed phase shifter disposed in parallel with said phase shifter, said input signal by a predetermined fixed phase shift to produce a fixed phase shifted input signal;

detecting in a threshold detector when said phase shift reference signal reaches a predetermined threshold level, equivalent to the phase shift introduced by said fixed phase shifter and generating in response a switching signal;

switching at said output, in response to said switching signal, from said phase shifted input signal to said fixed phase shifted input signal for a predetermined period of time, during which time said trigger signal is generated, before switching back to said phase shifted input signal.

20. A method as claimed in claim 19, wherein the fixed phase shift is an inversion of the input signal.

21. A method as claimed in claim 19, wherein the threshold is set to a level representative of 180° phase shift from the phase shifter.

22. A method as claimed in claim 19, whereby the predetermined period of time is sufficient to reset said phase shifter.

* * * * *